United States Patent
Carey et al.

(10) Patent No.: US 6,266,218 B1
(45) Date of Patent: Jul. 24, 2001

(54) MAGNETIC SENSORS HAVING ANTIFERROMAGNETICALLY EXCHANGE-COUPLED LAYERS FOR LONGITUDINAL BIASING

(75) Inventors: Matthew Joseph Carey; Robert Edward Fontana, Jr., both of San Jose; Bruce Alvin Gurney, San Rafael, all of CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/428,734

(22) Filed: Oct. 28, 1999

(51) Int. Cl.⁷ .................................................. G11B 5/39
(52) U.S. Cl. .................. 360/324.12; 360/324.2; 360/327.3
(58) Field of Search ................ 360/324.12, 324.2, 360/327.1, 327.3, 327.32

(56) References Cited

U.S. PATENT DOCUMENTS

| | | | |
|---|---|---|---|
| 5,302,461 | 4/1994 | Anthony | 428/472 |
| 5,465,185 | 11/1995 | Heim et al. | 360/113 |
| 5,528,440 | 6/1996 | Fontana et al. | 360/113 |
| 5,729,410 | 3/1998 | Fontana, Jr. et al. | 360/113 |
| 5,729,411 | 3/1998 | Kishi et al. | 360/113 |
| 6,118,624 | * 9/2000 | Fukuzawa et al. | 360/113 |
| 6,172,859 | * 1/2001 | Watanabe et al. | 360/327.3 |

* cited by examiner

*Primary Examiner*—Jefferson Evans
(74) *Attorney, Agent, or Firm*—Lumen Intellectual property Services, Inc.

(57) ABSTRACT

A longitudinal bias structure to be placed adjacent a ferromagnetic free layer or a sense layer which is responsive to an external magnetic field and belongs to a magnetic sensor, for example a magnetic readback sensor such as an anisotropic magnetoresistive (AMR) sensor, giant magnetoresistive (GMR) sensor such as GMR spin valve sensor or GMR multilayer sensor or in tunnel valve sensor. The longitudinal bias structure is built up of a top ferromagnetic bias layer of first thickness $t_1$ having a first magnetic moment $M_1$, a bottom ferromagnetic bias layer of second thickness $t_2$ having a second magnetic moment $M_2$ which is anti-parallel to first magnetic moment $M_1$ of the top ferromagnetic bias layer, and an exchange-coupling layer disposed between the top and bottom bias layers. In this configuration the top ferromagnetic bias layer and the bottom ferromagnetic bias layer are antiferromagnetically coupled by the exchange-coupling layer and the remnant magnetization thickness product of the bias structure is desirably low and equal to $M_1 t_1 - M_2 t_2$. The longitudinal bias structure can further include an antiferromagnetic layer next to one of the ferromagnetic bias layers to provide a pinned longitudinal bias structure.

26 Claims, 8 Drawing Sheets

MAGNETIC SENSORS HAVING ANTIFERROMAGNETICALLY EXCHANGE-COUPLED LAYERS FOR LONGITUDINAL BIASING

FIELD OF THE INVENTION

This invention relates generally to magnetic sensors such as readback sensors used in magnetic recording systems. More particularly, the present invention relates to a structure for providing longitudinal bias for a sense layer in magnetoresistive sensors.

BACKGROUND OF THE INVENTION

Thin film magnetoresistive sensors or heads have been used in magnetic data storage devices for several years. The fundamental principles of magnetoresistance including anisotropic magnetoresistance (AMR), giant magnetoresistance (GMR) and spin tunneling have been well-known in the art for some time. Magnetic readback sensor designs have been build using these principles and other effects to produce devices capable of reading high density data. In particular, three general types of magnetic read heads or magnetic readback sensors have been developed: the anisotropic magnetoresistive (AMR) sensor, the giant magnetoresistive (GMR) sensor or GMR spin valve and the tunnel valve sensor. The construction of these sensors is discussed in the literature, e.g., in U.S. Pat. No. 5,159,513 or U.S. Pat. No. 5,206,590.

FIG. 1A shows a typical GMR readback sensor according to the prior art. The sensor has a high coercivity ferromagnetic pinned layer 4 with a fixed magnetic moment pointing unto the page and a low coercivity ferromagnetic free layer 5 with a movable magnetic moment, which can rotate from pointing into the page to pointing out of the page. The direction of the magnetic moment of the pinned layer 4 is fixed by exchange coupling with an antiferromagnetic layer 3. Pinned layer 4 and free layer 5 are separated by a thin film of copper 7 or other metal with a relatively long electron mean free path. Hard bias layers 6 provide a biasing magnetic field to the free layer 5.

This construction of the GMR sensor enables the magnetic moment of free layer 5 to rotate rapidly and easily in an externally applied magnetic field. Typically, such rotation of the magnetic moment of free layer 5 occurs during operation in response to an external magnetic field encoding corresponding data, e.g., in a track of a magnetic disk. In accordance with the well-known principles of magnetoresistance, rotating the magnetization alters the resistance of the GMR sensor to a current i passing between a first electrical contact 8A and a second electrical contact 8B by a certain value ΔR. (In general, the larger the value of ΔR in relationship to total resistance R, i.e., the larger ΔR/R the better the sensor.) This change in resistance due to rotation of the magnetization of free layer 5 can thus be electronically sensed and used in practical applications such as reading of magnetic data.

An important concern in the design of the sensor of FIG. 1A is the longitudinal bias of the free layer 5. The longitudinal direction is the direction in the plane of the air bearing surface and parallel to the layers of the sensor, i.e., from left to right in FIG. 1A as indicated by arrow L. The free layer must be biased by hard bias layers 6 so that the free layer has only a single magnetic domain. When no biasing is present, the magnetic moments in free layer 5 tend to establish a multi-domain state, as is well-known. When free layer 5 is allowed to have more than one magnetic domain, then it experiences Barkhausen jumps and other domain reorientation phenomena during magnetic reversal as when responding to external magnetic fields encoding data in a magnetic recording disk. This problem is also known in the art and is highly undesirable as it produces noise and worsens the signal-to-noise ratio (SNR) of the sensor.

In order to provide the longitudinal biasing field and prevent Barkhausen noise several schemes have been employed. One uses hard bias layers 6 that have a high coercivity. For more details on longitudinal biasing using a hard biasing ferromagnetic layer the reader is referred to U.S. Pat. No. 5,729,410 to Fontana, Jr. et al.

Another longitudinal biasing scheme, sometimes also referred to as a continuous spacer design scheme, is illustrated in FIG. 1B. This figure uses the same reference numerals as FIG. 1A to designate corresponding parts. The order of layers in sensor of FIG. 1B is opposite from that in FIG. 1A and an additional buffer layer 1 and cap layer 2 are provided. In this scheme a single magnetic layer 9A, e.g., a Ni—Fe layer, is fixed or pinned by an antiferromagnet 9n in contact with magnetic layer 9A and both are located adjacent free layer 5. Magnetic layer 9A provides a magnetic moment indicated by the arrow adjacent to free layer 5 for longitudinal biasing of free layer 5. For more details on this longitudinal biasing scheme the reader is referred to U.S. Pat. No. 5,528,440 to Fontana et al.

For proper biasing, the longitudinal bias layers should have a remnant magnetization several times the thickness product ($M_r T_{bias}$) that is proportional to the $M_r T_{free}$ of the free layer. A typical value for the hard bias $M_r T_{bias}$ product is 1.7 times the free layer $M_r T_{free}$ product.

Developers of data storage devices are constantly striving to reduce the dimensions of readback sensors so that the data density of magnetic data storage products is increased. In order to increase the data density, the thickness of the free layer must be decreased. For a data density of about 3 Gb/in$^2$, the free layer should have a magnetic moment equivalent to that of about 70 Angstroms of $Ni_{80}Fe_{20}$ alloy; for a data density of about 40 Gb/in$^2$, the free layer should have a thickness equivalent to about 45 Angstroms of $Ni_{80}Fe_{20}$ alloy. For typical materials used the physical thickness of the free layer will drop from about 70 Angstroms at 3 Gbit/in$^2$ to as thin as 30 Angstroms at 40 Gbit/in$^2$.

Reducing the thickness (and therefore $M_r T_{free}$) of the free layer requires a corresponding reduction in the $M_r T_{bias}$ of the hard bias layers. Specifically, the proportionality constant between the free layer $M_r T_{free}$ and hard bias $M_r T_{bias}$ (i.e. 1.7) should be roughly preserved, although the exact value depends on specific geometric considerations. However, problems are encountered when one attempts to reduce the $M_r T_{bias}$ value of the hard bias layers. Under these conditions, the reduction in coercivity of CoPt alloys typically used in hard bias layers is a well-known problem.

The $M_r T_{bias}$ value of the hard bias layer can be reduced by decreasing its thickness. However, this is undesirable because it reduces the coercivity of the hard bias layer, making it susceptible to external fields and its own demagnetizing fields and thus making it less effective at suppressing Barkhausen noise. Further, a hard bias layer with reduced thickness may be unstable and magnetically decays over time. This could result in a reduced lifetime of the readback sensor. The magnetic stability of hard bias layers for hard bias could be increased by increasing the magnetic anisotropy of the hard bias layer material, but this has proved difficult with conventional CoPt based materials.

Referring back to Fig. 1B, schemes that employ longitudinal bias using antiferromagnet 9B in contact with a single magnetic layer 9A (continuous spacer design) need that antiferromagnet 9B to stabilize bias magnetic layer 9A along the longitudinal direction. Since the longitudinal direction is not in the direction of pinned layer 4, which uses antiferromagnet 3 a difficulty arises in setting antiferromagnets 3 and 9B simultaneously. Thus, a scheme which does not use an antiferromagnet in the longitudinal bias is desirable. However, if an antiferromagnet is used, it is desirable to increase the exchange field between the antiferromagnet and longitudinal bias layer to increase the magnetic stability of the longitudinal bias so that it is not disturbed by external fields or its own demagnetizing field.

Finally, there exists a need in the art of micromagnetic sensors for a longitudinal biasing structure that is capable of providing longitudinal biasing of extremely thin ferromagnetic films. Such a longitudinal biasing structure would facilitate the use of magnetic readback sensors in data storage devices having extremely high data densities.

OBJECTS AND ADVANTAGES OF THE INVENTION

Accordingly, it is a primary object of the present invention to provide a structure for longitudinal biasing of magnetic thin films that:

1) can provide longitudinal biasing of extremely thin films;
2) has a high coercive field;
3) is relatively simple to fabricate;
4) can be used in anisotropic magnetoresistive sensors (AMR), giant magnetoresistive (GMR) sensors, and tunneling valves;
5) can be set using an ordinary electromagnet with or without field cooling in a conventional oven;
6) is compatible with known magnetoresistive readback sensor materials and designs;
7) is compatible with known techniques for fabricating magnetoresistive readback sensors; and
8) can simultaneously have a very small $M_r t$ product and a high reversing field and stability.

These and other objects and advantages will be apparent upon reading the following description and accompanying drawings.

SUMMARY OF THE INVENTION

The objects and advantages of the invention are achieved by a longitudinal bias scheme or a longitudinal bias structure which biases a ferromagnetic free layer belonging to a magnetic sensor. The ferromagnetic free layer has a magnetization $M_0$ which is responsive to an external magnetic field. The longitudinal bias structure is located adjacent the free layer and is built up of a top ferromagnetic bias layer of first thickness $t_1$ having a first magnetic moment $M_1$, a bottom ferromagnetic bias layer of second thickness $t_2$ having a second magnetic moment $M_2$ which is anti-parallel to first magnetic moment $M_1$ of the top ferromagnetic bias layer, and an exchange-coupling layer disposed between the top and bottom bias layers. A thickness $t_{nm}$ of the exchange coupling layer is adjusted to ensure anti-parallel coupling between top and bottom ferromagnetic bias layers across the exchange-coupling layer. The remnant magnetization thickness product $M_r t$ of the longitudinal bias structure is equal to $M_1 t_1 - M_2 t_2$ and is consequently low, as is desirable.

The longitudinal bias structure of the invention can be used in various types of magnetic sensors. For example, the structure can be employed in anisotropic magnetoresistive (AMR) sensors, giant magnetoresistive (GMR) sensors such as GMR spin valve sensors or GMR multilayer sensors or in tunnel valve sensors. When employed in tunnel valve sensors an electrical insulation is provided between the longitudinal bias structure and the magnetic sensor.

In one embodiment the longitudinal bias structure can further include an antiferromagnetic layer next to either the bottom or top ferromagnetic bias layer. This embodiment represents a pinned longitudinal bias structure.

The exchange-coupling layer is a non-magnetic layer and can be made of materials such as Ru, Cr, Rh or Cu. The top and bottom ferromagnetic bias layers can be made of materials such as Co, Fe, Ni or alloys containing these materials. Suitable alloys include, for example, CoFe and NiFe (permalloy). More magnetically hard alloys such as CoPt, CoPtCr, CoPtTa and the like can also be used, but these alloys may require that a strong exchange-coupling layer (e.g. Co) be placed between the hard bias layer and the anti-parallel spacer layer. The first magnetization $M_1$ and the second magnetization $M_2$ are such that a net magnetic moment of the bias structure in the external field is non-zero but relatively low. Preferably, the net magnetic moment of the bias structure is within the range equivalent to 0–50 Å of $Ni_{80}Fe_{20}$ alloy.

Magnetic sensors using the longitudinal bias structure according to the invention can be used for many purposes. Notably, they can be employed in magnetic read heads used in magnetic disk drives.

Further details of the invention and the embodiments are discussed below in the detailed description with reference to the attached drawing figures.

DETAILED DESCRIPTION

Figure 2A:
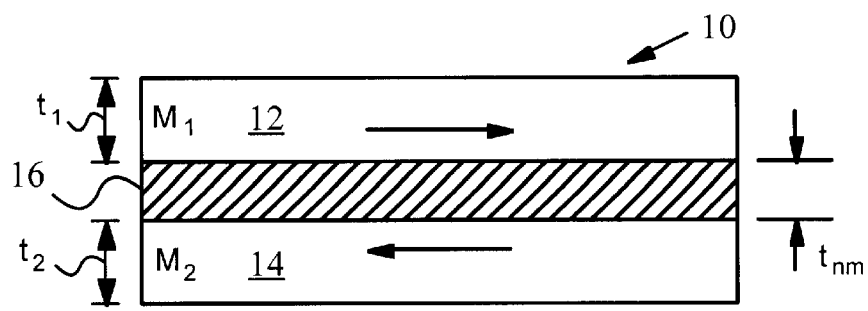
FIG. 2A is a schematic of a longitudinal bias structure according to the invention.

The salient features of the longitudinal biasing scheme according to the invention will be best understood by reviewing their schematics. In particular, FIG. 2A schematically illustrates a thermally-stable hard longitudinal bias structure 10 having a low remnant magnetization thickness product $M_r t$ Structure 10 has a top ferromagnetic bias layer 12 of thickness $t_1$ exhibiting a first magnetic moment $M_1$. A second ferromagnetic bias layer 14 of thickness $t_2$ and exhibiting a second magnetic moment G is separated from top bias layer 12 by an exchange-coupling layer 16. First magnetic moment $M_1$ and second magnetic moment $M_2$ are anti-parallel, as indicated by arrows representing the magnetic moments of layers 12, 14.

Exchange-coupling layer 16 is made of a non-magnetic material, e.g., a transition metal or an alloy containing a transition metal capable of inducing anti-parallel coupling between top layer 12 and bottom layer 14. A thickness $t_{nm}$ of exchange-coupling layer 16 should be chosen so that magnetizations of layers 12, 14 are anti-parallel when there is no applied magnetic field acting on structure 10. For example, thickness tnm can be in the range of 2–30 Å. Suitable material choices include Ru, Cr, Rh and Cu. A person of average skill in the art will be familiar with the choice of materials, since general principles of anti-parallel coupling in ferromagnet sandwiches are well-known in the art and are described, for example, in U.S. Pat. No. 5,465,185 to Heim et al.

Top and bottom bias layers 12, 14 thus antiferromagnetically (AF) exchange-coupled by non-magnetic exchange coupling layer 16 according to known physical principles are made of magnetic materials. Preferably, top and bottom bias layers 12, 14 are made of a magnetic material such as Co, Fe, Ni or their alloys. Suitable alloys include CoFe, NiFe, CoPt, CoPtCr, CoPtTa, CoPtCrB and permalloy. It should be noted that more than two bias layers 12, 14 can be AF coupled in this manner, and the resulting more complex structures can also be used in the longitudinal biasing scheme of the invention.

Because the magnetizations of bias layers 12, 14 are anti-parallel they subtract and thus reduce an overall or net magnetic moment of structure 10. Preferably, the net magnetic moment when no magnetic field is applied to structure 10 is low but non-zero. This can be ensured by selecting proper thickness values $t_1$, $t_2$ and magnetic moments $M_1$, $M_2$ using the fact that the remnant magnetization thickness product $M_r t$ of structure 10 due to anti-parallel alignment of magnetizations is $M_1 t_1 - M_2 t_2$. In general, thicknesses $t_1$, $t_2$ should each be less than 200 Å. Magnetic moments $M_1$, $M_2$ should be in the range of a fraction of a Tesla to several Tesla. The coercivity of such an anti-parallel structure is considerably higher than that of the constituent ferromagnetic layers 12, 14. An estimate of the enhancement factor for this anti-parallel structure is $(M_1 t_1 + M_2 t_2)/(M_1 t_1 - M_2 t_2)$, as is known in the literature. Exemplary values will be provided in the examples discussed below.

Figure 2B:
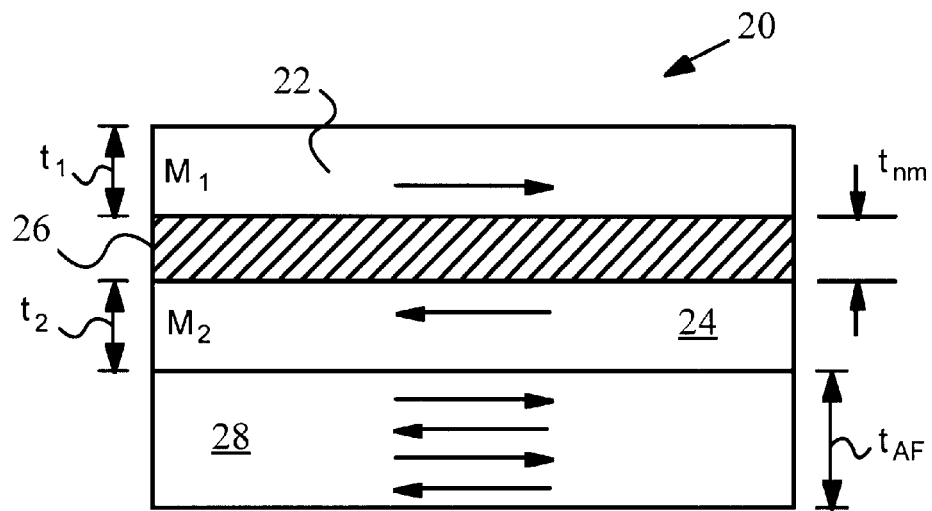
FIG. 2B is a schematic of a pinned longitudinal bias structure according to the invention.

FIG. 2B illustrates another thermally-stable and low $M_r t$ longitudinal bias structure 20. Structure 20 also has a top ferromagnetic bias layer 22 of thickness $t_1$, magnetization $M_1$ and a bottom ferromagnetic bias layer 24 of thickness $t_2$ and magnetization $M_0$ An exchangecoupling layer 26 ensures AF exchange-coupling between bias layers 22, 24. An additional antiferromagnetic layer 28 of thickness tAF is provided next to bottom bias layer 24. According to known principles AF layer 28 exchange biases bottom bias layer 24. In fact, AF layer 28 pins bottom bias layer 24 and ensures that both bias layers 22, 24 have a higher reversal field. The exchange field exhibited by a single ferromagnetic layer in contact with an antiferromagnet is approximately enhanced by a factor of $(M_1 t_1 + M_2 t_2)/(M_1 t_1 - M_2 t_2)$ when an anti-parallel structure is substituted, as is known in the art. Pinned bottom bias layer 24 can advantageously be set by cooling from above the blocking temperature of structure 20. This sets the stable state of pinned bottom bias layer 24 to be AF coupled to the direction of the setting field used and enhanced pinning stability. A person of average skill in the art will recognize that pinning of magnetic layers with an AF layer is known and used, e.g., in anti-parallel pinned spin valve sensors, and is described, for example, in U.S. Pat. No. 5,701,223.

One of longitudinal bias structures 10, 20 can be used with any magnetic sensor having a sensing layer such as a ferromagnetic free layer which requires biasing to ensure its single-domain magnetization. This is especially important in cases where the thickness of the free layer is small, e.g., between 1–100 Å.

Figure 3A:
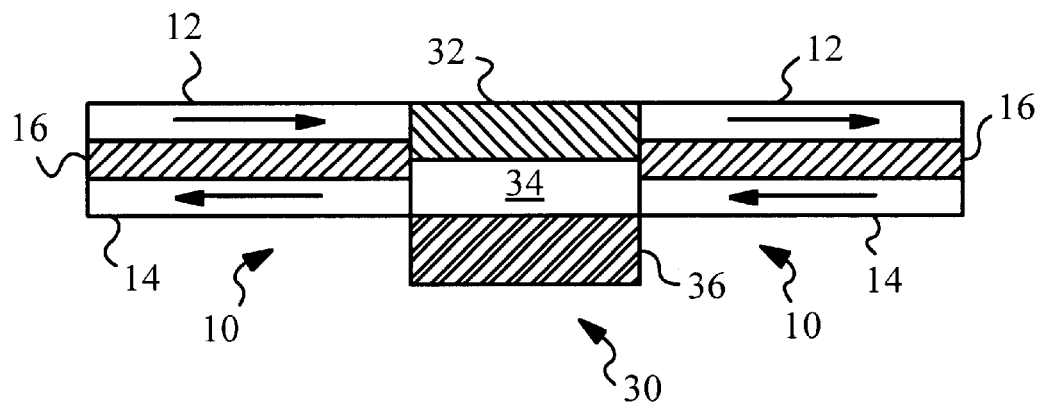
FIGS. 3A & B are schematics of a longitudinal bias structure and a pinned longitudinal bias structure used in an AMR sensor.
Figure 3B:
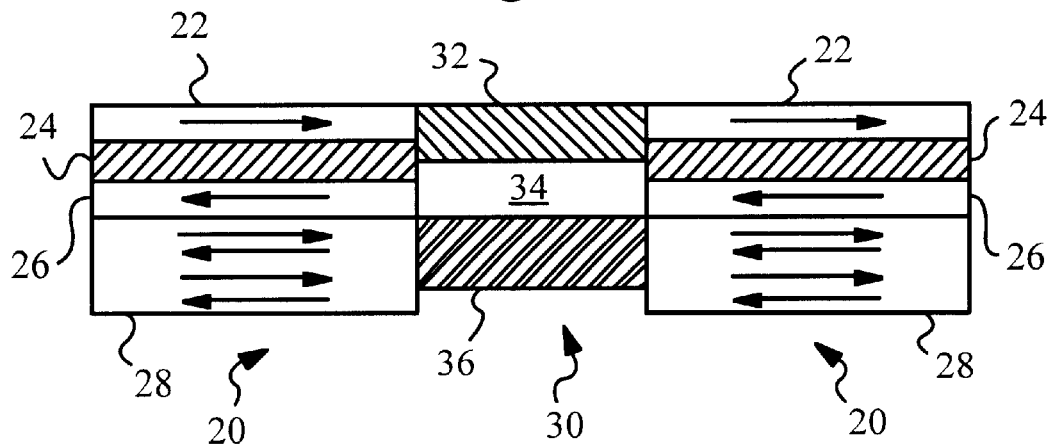

FIGS. 3A and 3B illustrate how longitudinal bias structure 10 and longitudinal bias structure 20 are employed in an anisotropic magnetoresistive (AMR) sensor 30. In FIG. 3A AMR sensor 30 uses longitudinal bias structure 10 to either side to bias a sensing layer or a ferromagnetic free layer 32. Sensor 30 also has a spacer layer 34 and a soft adjacent layer (SAL) 36, as is known in the art. In FIG. 3B AMR sensor 30 uses longitudinal bias structure 20 for biasing free layer 32.

Figure 4A:
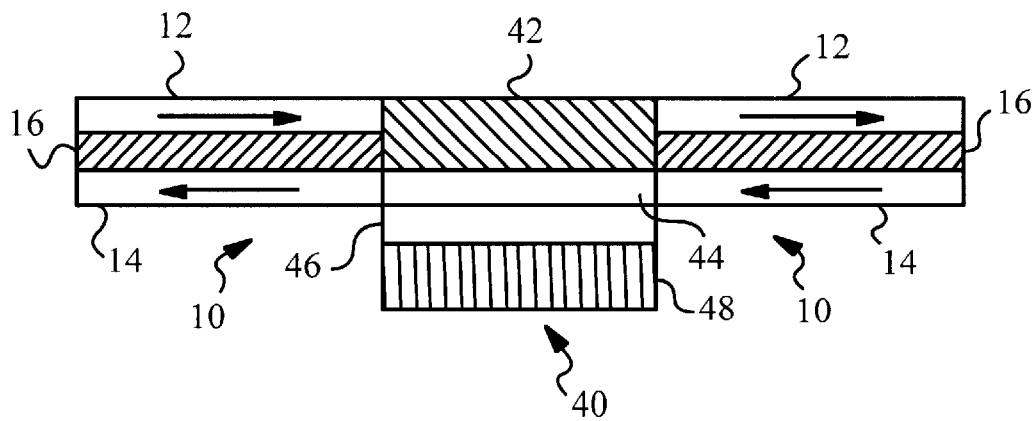
FIGS. 4A & B are schematics of a longitudinal bias structure and a pinned longitudinal bias structure used in a GMR spin valve sensor.
Figure 4B:
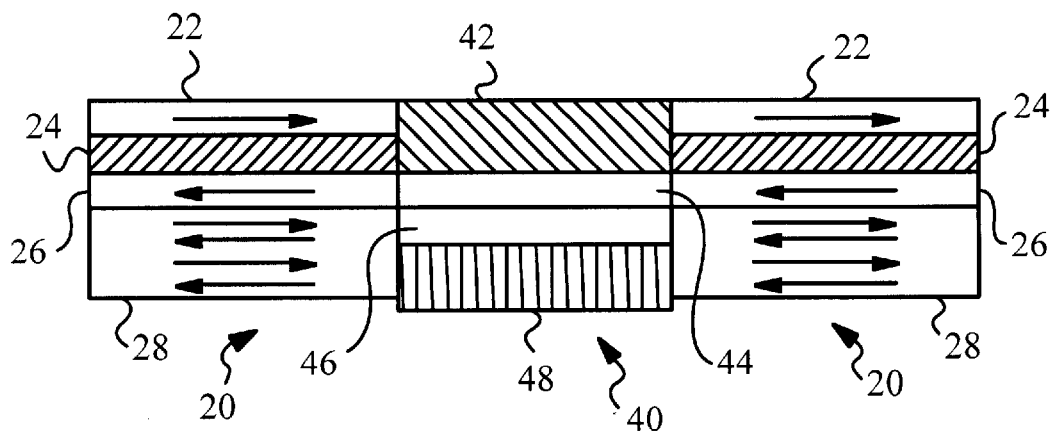

FIGS. 4A and 4B show how longitudinal bias structure 10 and longitudinal bias structure 20 are employed to bias a free layer 42 of a giant magnetoresistive (GMR) spin valve sensor 40. Spin valve 40 also has a spacer layer 44, a pinned layer 46 and an AF layer 48. It should be noted that spin valve sensor 40 can also be replaced by GMR multilayer sensor.

Figure 5A:
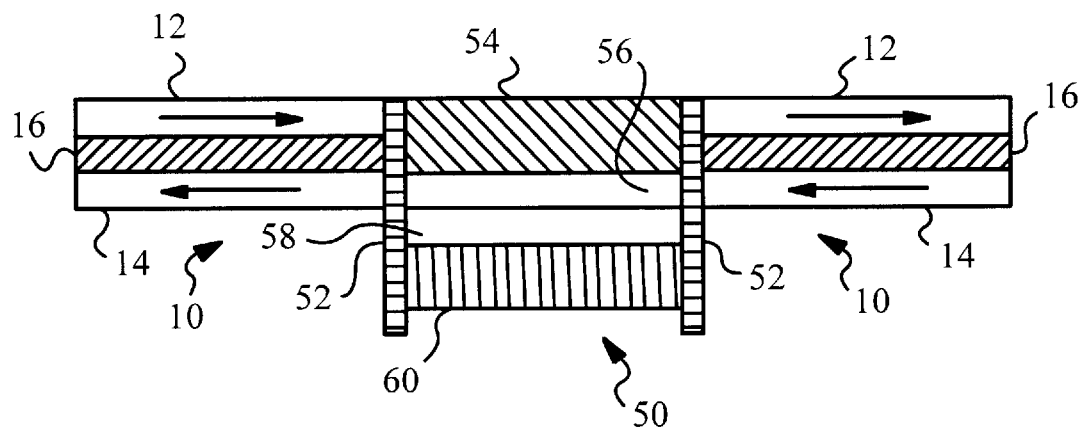
FIGS. 5A & B are schematics of a longitudinal bias structure and a pinned longitudinal bias structure used in a tunnel valve sensor.
Figure 5B:
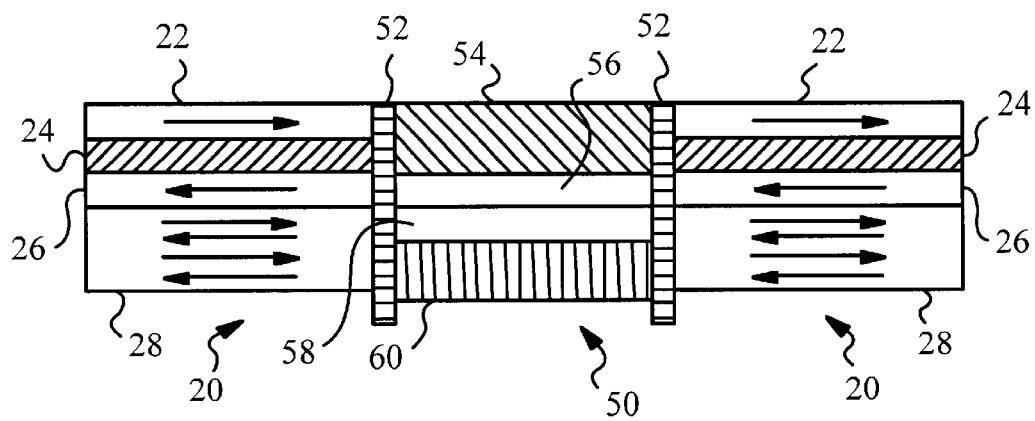

FIGS. 5A and 5B illustrate bias structures 10, 20 applied in a tunnel valve sensor 50. Due to the perpendicular flow of current in sensor 50 electrical insulation 52 is provided between bias structures 10, 20 and sensor 50. Sensor 50 has a free layer 54, an insulating spacer layer 56, a pinned layer 58 and an AF layer 60.

The schematic views of FIGS. 3–5 illustrate how the longitudinal bias structure of the invention is applied in magnetic sensors with a free layer which requires biasing. In all cases an external magnetic field affects a magnetization $M_0$ of the free layer and rotates it correspondingly. The physical principles behind this process of sensing external magnetic fields are well-known. The magnetic sensors with bias structures of the invention can be used in various applications, including magnetic read heads or readback sensors for reading data from a magnetic medium. In the latter case, the external magnetic field is produced by information bits stored in a magnetic medium, e.g., a magnetic disk. The following examples illustrate several readback sensors equipped with longitudinal bias structures of the invention.

EXAMPLES

Figure 6:
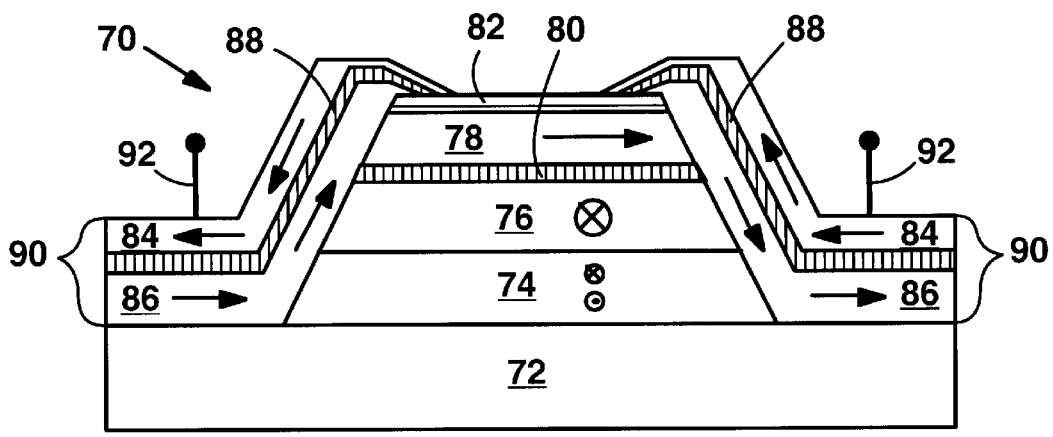
FIG. 6 shows a GMR sensor with a longitudinal bias according to the invention.

FIG. 6 shows a GMR readback sensor 70 equipped with a longitudinal bias structure 90 in accordance with the invention. Sensor 70 has a substrate 72, an antiferromagnetic (AF) layer 74, and a high coercivity ferromagnetic pinned layer 76 on top of AF layer 74. The magnetic moment of pinned layer 76 is fixed in a direction perpendicular to the page by exchange coupling with AF layer 74. A low coercivity ferromagnetic free layer 78 has a magnetic moment perpendicular to the magnetic moment of pinned layer 76 in zero applied field. The magnetic moment of free layer 78 is free to rotate when an external magnetic field is applied by magnetically stored information bits. A thin non-magnetic conductive layer 80 is disposed between pinned layer 76 and free layer 78. As is known in the art, conductive layer 80 has a thickness which is less than an electron mean free path in the conductive layer material. An additional cap layer 82 is disposed on top of the free layer 78. Cap layer 82 is non-magnetic and can be made, e.g., of Ta, Ru or the oxides of Ta, Ru, Si or Al.

According to the present invention, sensor 70 has a top ferromagnetic bias layer 84 and a bottom ferromagnetic bias layer 86 on either side. Bias layers 84, 86 are preferably less than 200 Å thick but still sufficiently thick to be thermally and magnetically stable so that sensor 70 lifetime is not adversely affected.

Bias layers 84, 86 are separated by a non-magnetic exchange-coupling layer 88. Together, layers 84, 86 and 88 constitute longitudinal bias structure 90 extending to the left and right of sensor 70. Electrical contacts 92 are typically made to top bias layer 84 on both sides of sensor 70.

In operation, current flows between the left portion of top bias layer 84 and the right portion of top layer 84 through contacts 92. When applied magnetic fields rotate magnetization $M_0$ of the free layer 78, a change in resistance is sensed due to the giant magnetoresistive effect. The operation of the present device is similar to the operation of prior art devices.

Bias layers 84, 86 each have an associated magnetic moment which is adjusted by appropriately selecting the thickness and the composition of the bias layers. AP structure 90 is made so that a longitudinal biasing field is applied to free layer 78. This is accomplished by choosing the magnetic moments of the bias layers so that with zero applied field, AP structure 90 has a nonzero net magnetic moment. In other words, the magnetic moments of top bias layer 84 and bottom bias layer 86 should be unequal on both sides of sensor 70. Both magnetostatic and exchange interactions between longitudinal bias layer 86 and free layer 78 are possible. In embodiments where the left and right portions of bottom bias layer 86 are in contact with free layer 78 an exchange interaction between free layer 78 and bias layer 86 will bias free layer 78 in the direction of bias layer 86, as clearly shown by the magnetization arrows. If the magnetic moment of left and right portions of bottom bias layer 86 is greater than the magnetic moment of left and right portions of top bias layer 84 then the magnetostatic interaction of the anti-parallel layer 84 with free layer 78 will add to the exchange interaction. If the net moment is opposite to bias layer 86 then the interaction will subtract. It will be understood that embodiments where there is no direct contact between longitudinal bias layers and the free layer (such that there is no exchange interaction) but which rely on the magnetostatic interaction will also provide a longitudinal bias to the free layer, and are a part of the present invention.

Figure 1A:
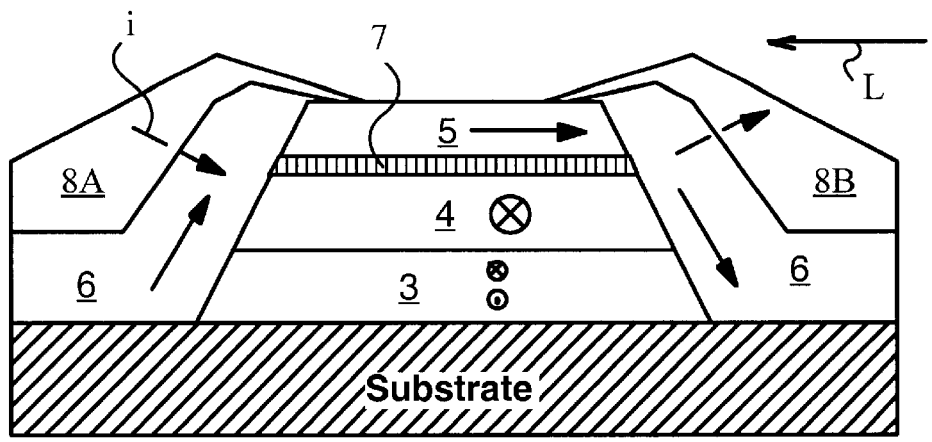
FIG. 1A (Prior Art) shows a magnetoresistive readback sensor with a longitudinal bias scheme.
Figure 1B:
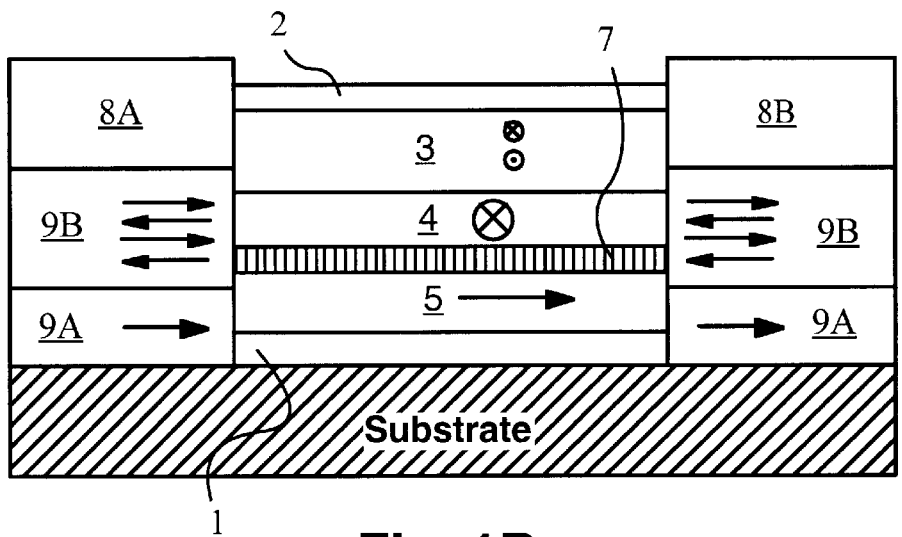
FIG. 1B (Prior Art) shows a magnetoresistive readback sensor with another longitudinal bias scheme.

Thus, when right and left portions of bottom bias layer 86 have higher magnetic moments than the right and left portions of top bias layer 84, then bottom bias layer 86 provides the field required for longitudinal biasing of free layer 78. The stability and reversal field of bottom bias layer 86 is greatly improved compared to conventional hard bias layers (as in FIG. 1) because bottom bias layer 86 is part of exchange coupled structure 90. Top bias layer 84 provides added stability to bottom bias layer 86 by exchange coupling with bottom bias layer 86 to reduce the net magnetic moment. Without top bias layer 84 bottom bias layer 86 would have lower reversal field and poorer stability.

Preferably, the magnetic moment of each bias layer 84, 86 is adjusted by individually controlling the thicknesses $t_1$, $t_2$ of the bias layers. In the embodiment of FIG. 6, bottom bias layer 86 is preferably made to have a relatively high magnetic moment compared to top bias layer 84 by making bottom bias layer 86 thicker. The thicknesses of bias layers 84, 86 also depends upon the required longitudinal bias field. If a large bias field is required, then bottom bias layer 86 should be made much thicker than top bias layer 84. For example, bottom bias layer 86 has a thickness of 35 Å, and top bias layer 84 has a thickness of 25 Å. In a specific sensor design, this results in a longitudinal bias with a reversal field of about 4 kOe applied to the edge of free layer 78.

Alternatively, the magnetic moment of each bias layer 84, 86 is adjusted by individually controlling the composition of the bias layers. In the embodiment of FIG. 6, bottom bias layer 86 is made to have a higher magnetization (dipole moment/volume) compared to top bias layer 84. The exact composition of the bias layers again depends upon the required longitudinal bias field. If a large bias field is required, then bottom bias layer 86 should be made to have much higher magnetization than top bias layer 84. As a specific example, bottom bias layer 86 is made of $CoFe_{40}$ with a magnetization of 2.2 Tesla, and top bias layer 84 is made of Co with a magnetization of 1.8 Tesla.

Of course, the magnetic moments of the bias layers can also be selected by individually adjusting both the thicknesses of the bias layers and the composition of the bias layers. As a general principle in the present invention, the bias layer most strongly coupled (magnetically) to the free layer should have the highest magnetic moment in order to obtain the largest bias. Making the bias layer which is more strongly coupled to the free layer with a lower moment is also acceptable, but the bias on the free layer will be smaller in that case and oppositely directed to the case where the larger moment layer is next to the free layer.

Figure 7:
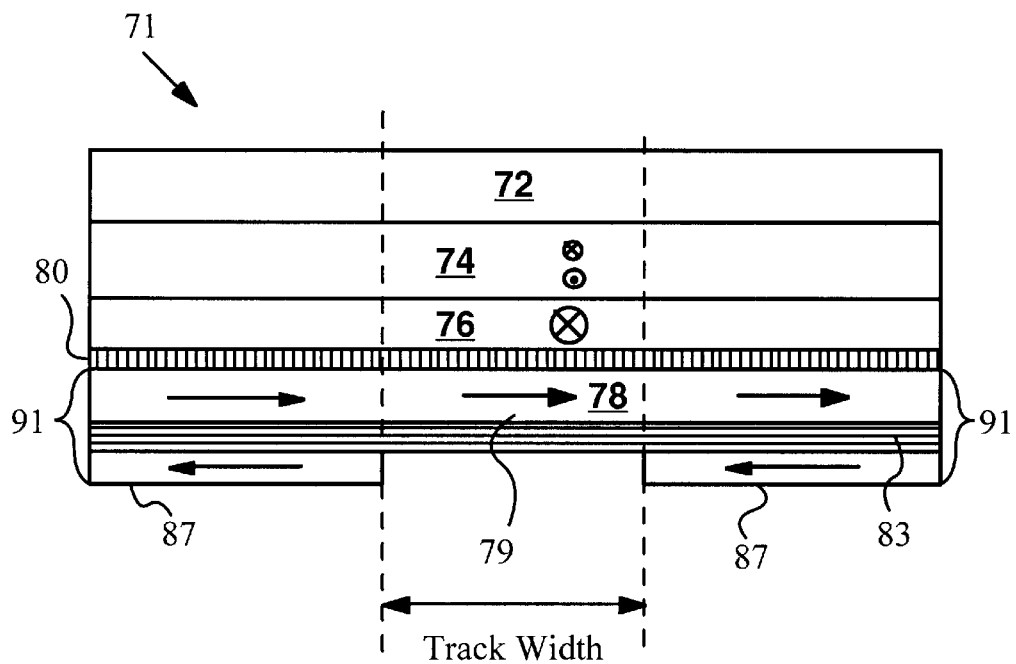
FIG. 7 shows a bottom spin valve sensor with a longitudinal bias according to the invention.

FIG. 7 shows an alternative embodiment of the present invention in which a longitudinal bias structure 91 is used in a so-called bottom spin valve sensor 71. Ferromagnetic layer 76 in sensor 71 is separated from free layer 78 by conductive layer 80 and is pinned by AF layer 74. Sensor 71 is also made on substrate 72 to which an additional spacer layer may be provided.

Free layer 78 in sensor 71 extends beyond the width of a track, which corresponds to the separation or distance between the right and left portions of bias structure 91. Free layer 78 is separated from a top bias layer 87 by spacer layer 83. This embodiment is very efficient on its use of the various layers in that right and left portions of bias structure 91 use portions of free layer 78 to the right and left of the track width as the bottom bias layer. In other words, anti-parallel exchange coupling is produced between top bias layer 87 and free layer 78 outside the track width across layer 83. Of course, at least the portion of layer 83 within the track width has to be conductive for proper operation of sensor 71.

An advantage of sensor 71 is that a strong exchange interaction is produced between the longitudinally biased portion of free layer 78 beyond the track width with a sense portion 79 of free layer 78 corresponding to the track width. This ensures excellent longitudinal biasing.

Figure 8:
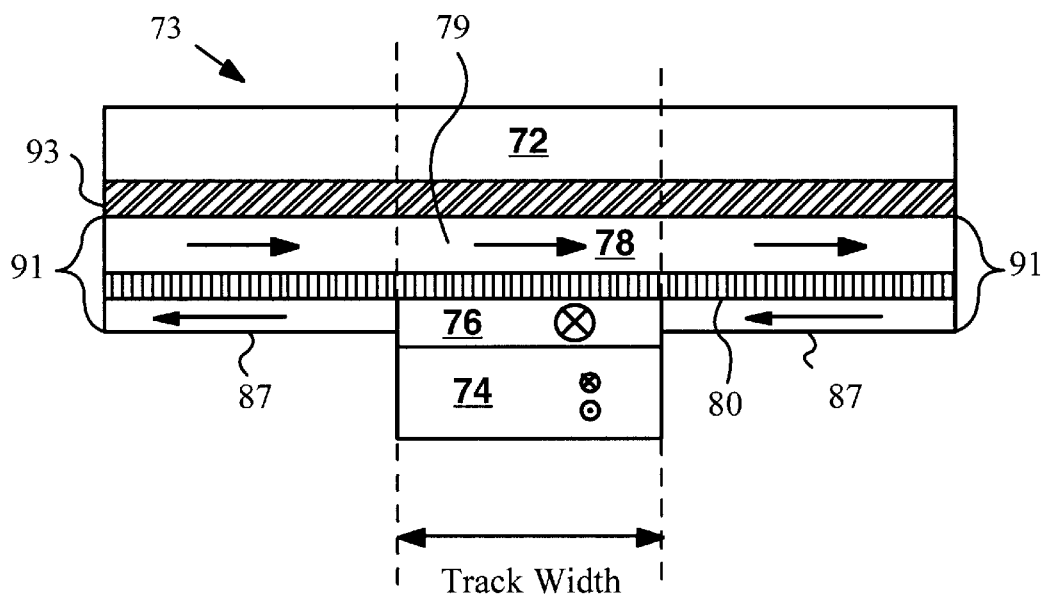
FIG. 8 shows a top spin valve sensor with a longitudinal bias according to the invention.

FIG. 8 shows an embodiment of the invention in which longitudinal bias structure 91 using portions of free layer 78 is used in a top spin valve 73. Top spin valve 73 is similar to bottom spin valve 71 in that its free layer 78 extends beyond the track width as well. In top spin valve 73 free layer 78 is near the bottom of sensor 73 and is separated from substrate 72 by a spacer layer 93. Ferromagnetic layer 76 and AF layer 74 for pinning it are located between right and left portions of longitudinal bias structure 91. Conductive layer 80 is interposed between free layer 78 and ferromagnetic layer 76. Preferably, in the making of top spin valve 73 upper layers of spin valve 73 are removed on both sides of the track width by using lithographic definition and ion milling. After this, bias structure 91 is built up.

As in the case of bottom spin valve 71, an advantage of sensor 73 is that the strong exchange interaction between the longitudinally biased portions of free layer 78 beyond the track width with sense portion 79 ensures excellent biasing. It should also be noted that in either top or bottom spin valve an additional AF layer can be placed on top of top bias layer 87 for producing pinned longitudinal bias structures, as described above.

It is noted that the difference in magnetic moments of the top layers and bottom layers should be scaled with the bias field requirements of the free layer. For example, if the free layer is exceptionally thin (e.g., less than 20 Å), a relatively weak bias field is required, and the top and bottom bias layers should have approximately equal magnetic moments. If a strong bias field is required, the top layers and bottom layers should have substantially different magnetic moments. The exact magnetic moments of the bias layers depends greatly upon the magnetic characteristics of the free layer, the geometry of the structure and the junction (i.e. magnetic coupling) between the free layer and bias layers. A person of average skill in the art will be able to optimize the selection of magnetic moments on a case by case basis.

Figure 9:
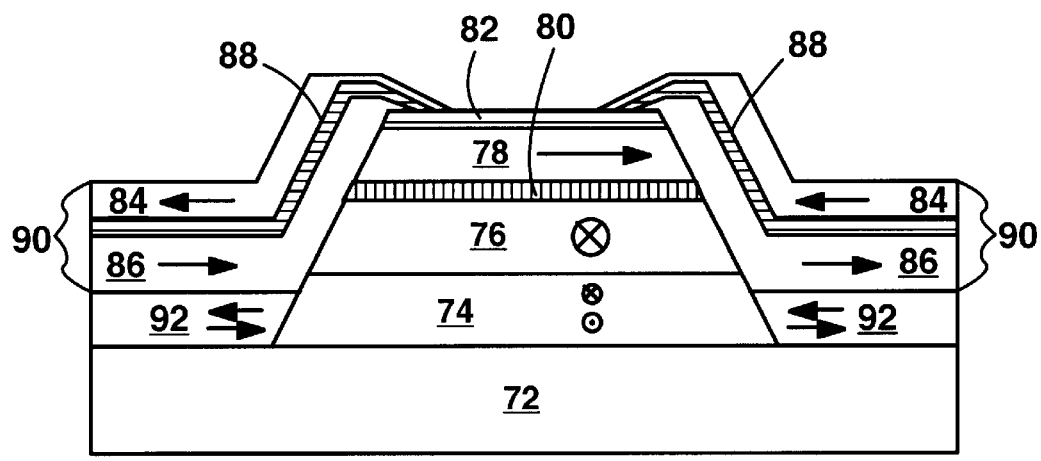
FIG. 9 shows an alternative embodiment of the longitudinal bias layer including an AF layer in a GMR sensor.

Although the anti-parallel longitudinal bias structure 90 of the present invention has a high coercivity compared to prior art hard bias layers, further improvement is also provided within the scope of the present invention. FIG. 9 shows a preferred embodiment of the present invention having longitudinal bias structure 90 with substantially improved reversal field compared to the devices of FIGS. 6–8. The device has an AF layer 92 extending under structure 90 on the left and right. It should be noted that AF layer 92 can At also be deposited on top of structure 90, i.e., on top of top bias layer 84.

The left portion of AF layer 92 is exchange coupled with the left portion of bottom bias layer 86; the right portion of AF layer 92 is exchange coupled with the right portion of bottom bias layer 86. AF layer 92 provides exchange anisotropy to the magnetizations of the AP bias structure 90. AF layer 92 helps to increase the coercivity and exchange field shift of bottom bias layer 86, as is known in the science of antiferromagnetic exchange anisotropy.

Figure 10:
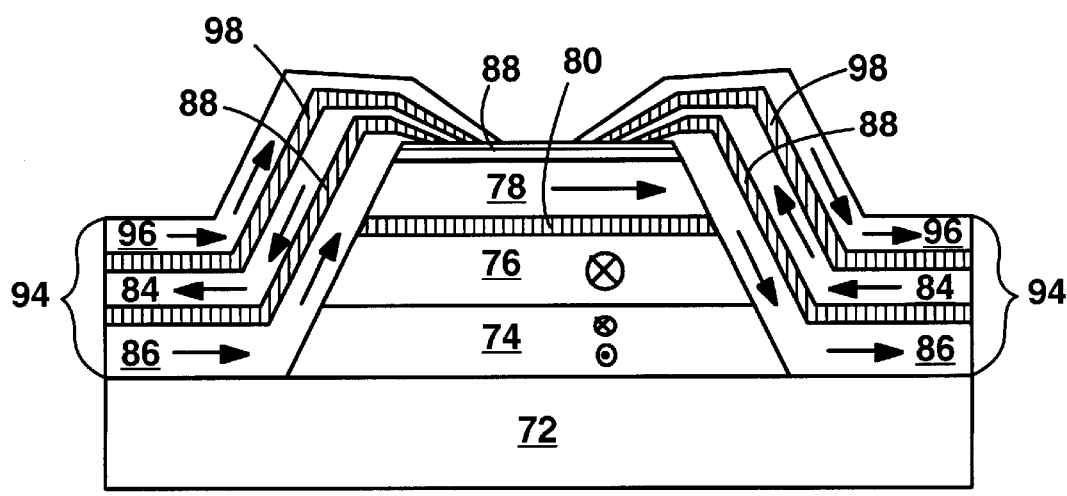
FIG. 10 shows an embodiment of the longitudinal bias structure having three ferromagnetic bias layers employed in a GMR sensor.

In the present invention, the longitudinal bias structure can have more than three constituent anti-parallel bias layers. FIG. 10 shows an embodiment where a longitudinal bias structure 94 has three ferromagnetic bias layers. The bottom-most layers 86, 84 are coupled to free layer 78 as is a top-most layer 96. A second exchange-coupling layer 98 is provided between ferromagnetic bias layers 84 and 96. Second exchange-coupling layer 98 and third bias layer 96 provide increased coercivity for the bias structure 94. Of course, second exchange-coupling layer 98 must be made of a material which induces antiferromagnetic exchange coupling.

With increased number of bias layers the bias layer most strongly coupled to free layer 78 should preferably have the highest magnetic moment to obtain the strongest exchange bias. Any of the bias layers 84, 86, 96 can be most strongly coupled to free layer 78. It should be noted that the structure shown in FIG. 10 can contain an AF layer in contact with bias layer 86 or bias layer 96 of both. This structure can also be employed in the previous embodiments shown in FIGS. 6–9.

Figure 11:
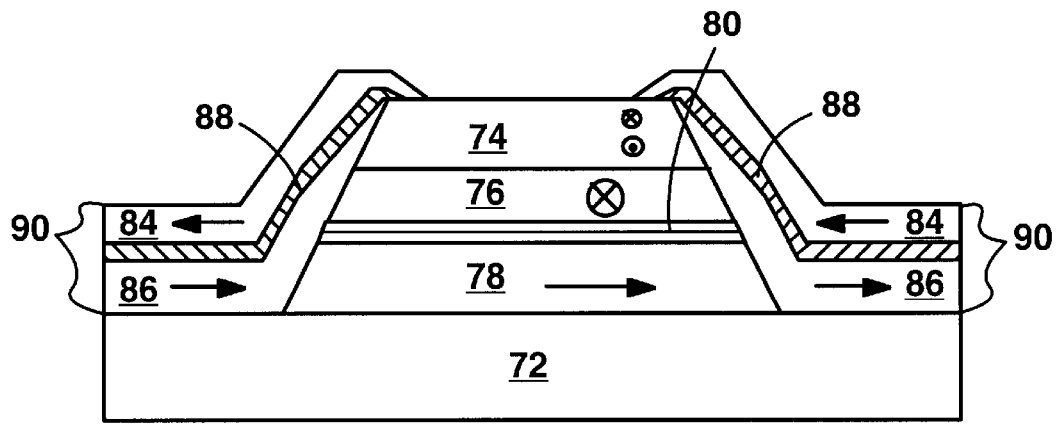
FIG. 11 shows a longitudinal bias structure according to the invention in a sensor having a buried free layer.

Of course, the present invention is applicable to devices where free layer 78 is buried under pinned layer 76. FIG. 11 shows such a device. Bottom bias layer 86 provides bias for free layer 78 in this case. It will be apparent to one skilled in the art that the variations illustrated in FIGS. 9 and 10 are also applicable to devices where the free layer is buried under the pinned layer.

Figure 12:
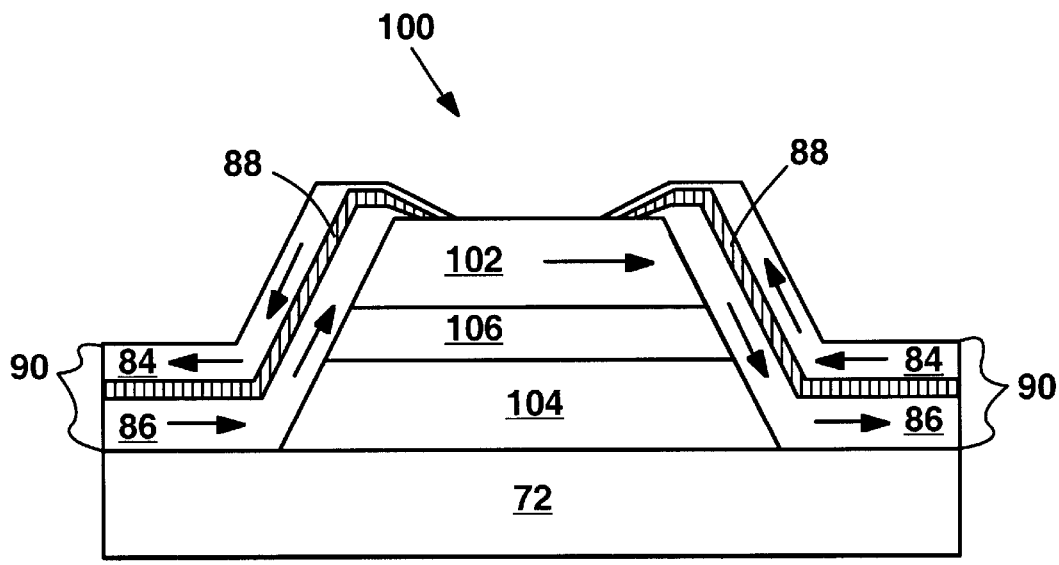
FIG. 12 shows a longitudinal bias structure according to the invention in an anisotropic magnetoresistive structure.

As discussed above, present invention is also applicable to other sensors, e.g., anisotropic AMR sensors, as illustrated in FIG. 12. Here an AMR sensor 100 is provided with longitudinal bias structure 90 according to the present invention. Sensor 100 has a free or sense layer 102 to be biased, a SAL layer 104 and a spacer layer 106 separating layers 100 and 102. As in the case of GMR sensors discussed above, longitudinal bias structure 90 can be coupled with an AF layer, or can have more than the two ferromagnetic bias layers shown. Also, either the top bias layer 84 or bottom bias layer 86 can be more strongly magnetically coupled to sense layer 102.

Figure 13:
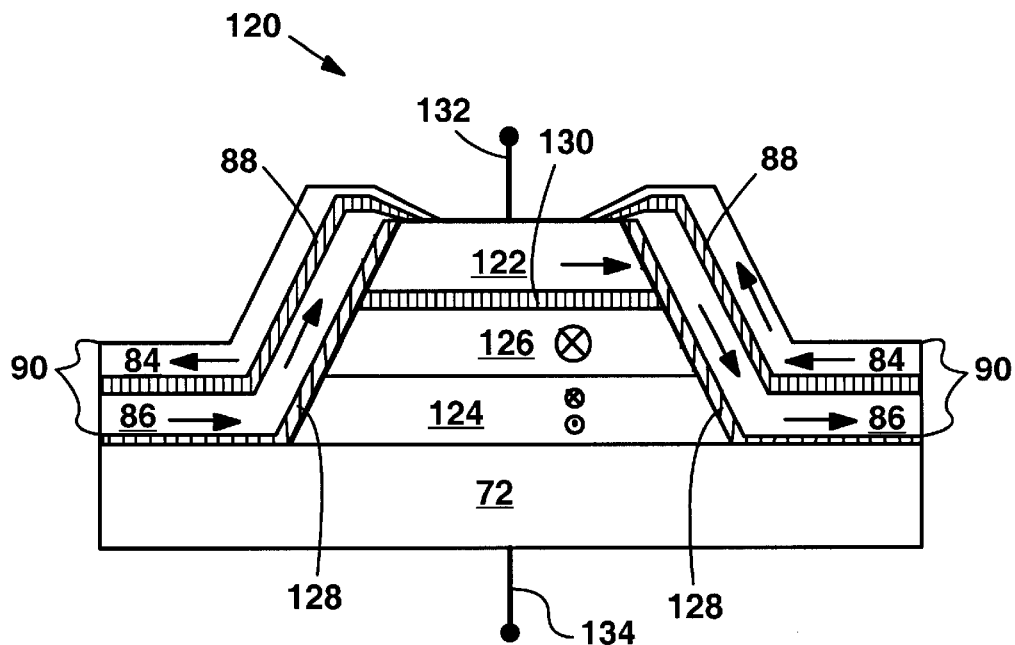
FIG. 13 shows a tunnel valve sensor, specifically a magnetic tunnel junction (MTJ) sensor equipped with a longitudinal bias structure according to the invention.

The present invention is also applicable to tunnel valve devices, as discussed above. FIG. 13 shows a magnetic tunnel junction (MTJ) sensor 120 equipped with longitudinal bias structure 90 according to the present invention. Sensor 120 has thin, electrically insulating barriers 128 which electrically insulate a free layer 122 from the bias layers 84, 86. A tunnel barrier 130 is disposed between free layer 122 and a pinned layer 126. Tunnel barrier 130 can be made of a thin film of $SiO_2$, alumina, boron nitride or another dielectric material. An electrical contact 132 is connected to free layer 122, and an electrical contact 134 is connected to substrate 72 or a bottom electrical lead layer (not shown).

In operation, a sense current provided at electrical contact 134 flows from substrate 72 or from bottom electrical lead layer through the tunnel barrier 130 and to electrical contact 132. Longitudinal bias structure 90 provides bias to free layer 122 in the same manner as in the sensor of FIG. 6. However, it is important to note that since structure 90 must be ohmically insulated from free layer 122, bias layers 84, 86 may need to have somewhat higher net magnetic moments than for a spin valve structure.

Figure 14:
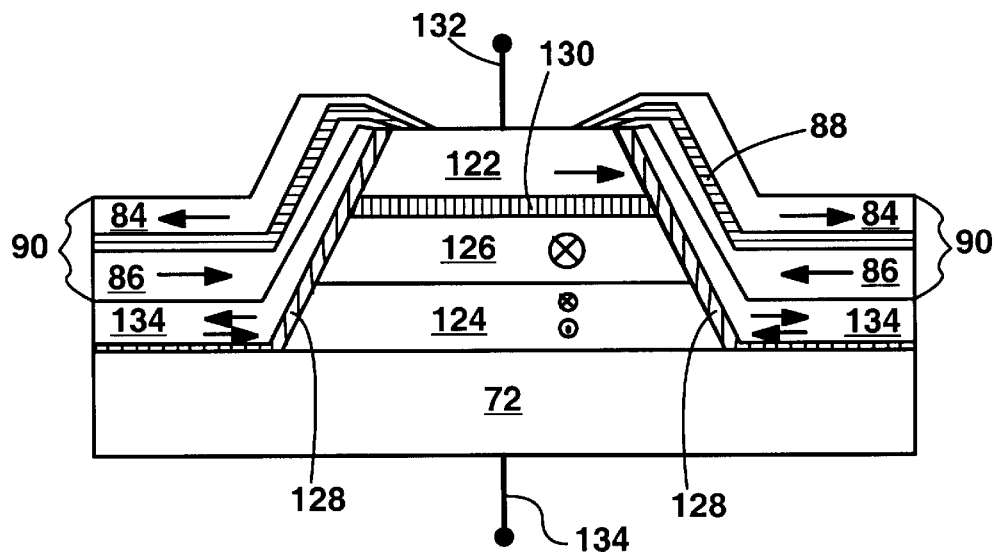
FIG. 14 shows a tunnel value sensor provided with a longitudinal bias structure according to the invention.

FIG. 14 shows an embodiment in which longitudinal bias structure 90 is coupled with an AF layer 134. It is understood that bias structure 90 without AF layer 134 will function as well. Also, bias structure can have more than the two bias layers shown, as discussed above.

The sensors of the present invention are made using conventional masking thin film deposition and photolithographic techniques. The bias layers 84, 86 of FIG. 6 and exchange coupling layer 88 are deposited and patterned using lift-off techniques or etching (e.g. wet etching, dry plasma etching, ion milling or other suitable techniques). Preferably, the bias layers and exchange coupling layer are deposited after pinned layer 76 and free layer 78 have been deposited. It is also preferable that bottom bias layer 86 be deposited and patterned in the same steps so that they have identical thicknesses are compositions, except where free layer 78 is used as one of the layers to be anti-parallel pinned (as in the embodiments in FIGS. 7–8). Similarly, exchange coupling layer 88 should be deposited and patterned in the same steps, as is also true for top bias layer 84. Deposition and patterning of magnetic thin films is well known in the art.

After the appropriate thin films are deposited and patterned, the magnetizations of the bias layers must be properly initialized. This can be accomplished using conventional initialization techniques. The magnetic moments in the bias layers 84, 86 spontaneously align in an antiparallel fashion when the initializing field is applied. More specifically, the heads can be initialized by immersion in a field that exceeds the coercivity of the bias layer (typically 1–3 kOe) but is low enough not to significantly disturb the sensor, i.e., the spin valve, the tunnel valve or the AMR sensor.

For the embodiments of FIGS. 9 and 14, the fabrication process is more involved due to the multiple AF layers which must be initialized. The antiferromagnetic layers must have different exchange bias orientations (i.e. AF layer 74 has magnetic axes oriented parallel with the page and AF layer 74 has magnetic axis oriented perpendicular to the page). One way in which these different magnetic axes can be provided is by using antiferromagnetic materials with different blocking temperatures, and initializing the magnetic axes of the AF layers at different temperatures. For example AF layer 92 is made of a low blocking temperature material with blocking temperature T1, and AF layer 74 is made of a high blocking temperature material with blocking temperature T2. First, the sensor is heated to a temperature above T2, and a field is applied in a direction parallel with the desired axis orientation of AF layer 74. Then, the sensor is cooled to a temp between T1 and T2 with the field applied. This fixes the magnetic axis of AF layer 72. Then, the field is oriented parallel with the desired axis orientation of AF layer 92 and the sensor is cooled to below T1. This method provides the different magnetic axes required for the AF layer 74 and the AF layer 92. A disadvantage of this technique is that the AF layer 92 and layer 74 must be made of different AF materials. Preferably, bias layers 84, 86 are initialized after AF layers 74, 92 are initialized. In some cases, it is sufficient to only apply a magnetic field to properly orient the pinned or anti-parallel bias layers. Is it also possible to orient the pinned layer with a current pulse, as is known in the art.

It will be clear to one skilled in the art that the above embodiment may be altered in many ways without departing from the scope of the invention. Accordingly, the scope of the invention should be determined by the following claims and their legal equivalents.

What is claimed is:

1. A longitudinal bias structure for biasing a ferromagnetic free layer of a magnetic sensor, said ferromagnetic free layer having a magnetization $M_0$ responsive to an external magnetic field, said longitudinal bias structure being positioned adjacent to said ferromagnetic free layer and comprising:

a) a top ferromagnetic bias layer of a first thickness $t_1$ and having a first magnetic moment $M_1$;

b) a bottom ferromagnetic bias layer of a second thickness $t_2$ and having a second magnetic moment $M_2$;

c) an exchange-coupling layer of thickness $t_{nm}$ disposed between said top ferromagnetic bias layer and said bottom ferromagnetic bias layer, said thickness $t_{nm}$ being selected such that said second magnetic moment $M_2$ is maintained anti-parallel to said first magnetic moment $M_1$ by antiferromagnetic exchange-coupling between said top ferromagnetic bias layer and said bottom ferromagnetic bias layer;

whereby a remnant magnetization thickness product $M_r t$ of said longitudinal bias structure is equal to $M_1 t_1 - M_2 t_2$.

2. The longitudinal bias structure of claim 1, wherein said magnetic sensor is an anisotropic magnetoresistive (AMR) sensor.

3. The longitudinal bias structure of claim 1, wherein said magnetic sensor is a giant magnetoresistive (GMR) sensor.

4. The longitudinal bias structure of claim 3, wherein said GMR sensor is selected from the group consisting of GMR spin valve sensors and GMR multilayer sensors.

5. The longitudinal bias structure of claim 1, wherein said magnetic sensor is a tunnel valve sensor.

6. The longitudinal bias structure of claim 5, further comprising an electrical insulation from said tunnel valve sensor.

7. The longitudinal bias structure of claim 1, further comprising an antiferromagnetic layer next to said bottom ferromagnetic bias layer, thereby creating a pinned longitudinal bias structure.

8. The longitudinal bias structure of claim 1, wherein said exchange-coupling layer is a non-magnetic layer.

9. The longitudinal bias structure of claim 8, wherein said exchange-coupling layer is made of a material selected from the group consisting of Ru, Cr, Rh, Cu.

10. The longitudinal bias structure of claim 1, wherein said first magnetization $M_1$ and said second magnetization $M_2$ are selected such that a net magnetic moment of said longitudinal bias structure in said external field is non-zero.

11. The longitudinal bias structure of claim 10, wherein said net magnetic moment is in a range equivalent to 0–50 Å of $Ni_{80}Fe_{20}$ alloy.

12. The longitudinal bias structure of claim 1, wherein at least one of said top ferromagnetic bias layer and said bottom ferromagnetic bias layer comprises a material selected from the group consisting of Co, Fe, Ni and alloys of Co, Fe and Ni.

13. The longitudinal bias structure of claim 12, wherein at least one of said top ferromagnetic bias layer and said bottom ferromagnetic bias layer comprises an alloy selected from the group consisting of CoPt, CoFe, CoPtCr, CoPtTa, CoPtCrB and permalloy.

14. The longitudinal bias structure of claim 1, wherein said bottom ferromagnetic bias layer comprises a portion of said free layer.

15. The longitudinal bias structure of claim 14, wherein said magnetic sensor is selected from the group consisting of top spin valve sensors, bottom spin valve sensors, giant magnetoresistive (GMR) sensors, tunnel valve sensors, and anisotropic magnetoresistive (AMR) sensors.

16. A magnetic sensor for sensing an external magnetic field, said magnetic sensor comprising:

a) a ferromagnetic free layer having a magnetization $M_0$ responsive to said external magnetic field;

b) a longitudinal bias structure positioned adjacent said ferromagnetic free layer for biasing said ferromagnetic free layer, said longitudinal bias structure comprising:

1) a top ferromagnetic bias layer of first thickness $t_1$ having a first magnetic moment $M_1$;

2) a bottom ferromagnetic bias layer of second thickness $t_2$ having a second magnetic moment $M_2$ anti-parallel to said first magnetic moment $M_1$;

3) an exchange-coupling layer disposed between said top ferromagnetic bias layer and said bottom ferromagnetic bias layer, such that said top ferromagnetic bias layer and said bottom ferromagnetic bias layer are antiferromagnetically coupled by said exchange-coupling layer;

whereby a remnant magnetization thickness product $M_r t$ of said longitudinal bias structure is equal to $M_1 t_1 - M_2 t_2$.

17. The magnetic sensor of claim 16, wherein said longitudinal bias structure further comprises an antiferromagnetic layer next to said bottom ferromagnetic bias layer, thereby creating a pinned longitudinal bias structure.

18. The magnetic sensor of claim 16, wherein said exchange-coupling layer is a non-magnetic layer.

19. The magnetic sensor of claim 18, wherein said exchange-coupling layer is made of a material selected from the group consisting of Ru, Cr, Rh, Cu.

20. The magnetic sensor of claim 16, wherein said net magnetic moment is in a range equivalent to 0–50 Å of $Ni_{80}Fe_{20}$ alloy.

21. The magnetic sensor of claim 16, wherein at least one of said top ferromagnetic bias layer and said bottom ferromagnetic bias layer comprises a material selected from the group consisting of Co, Fe, Ni and alloys of Co, Fe and Ni.

22. The magnetic sensor of claim 21, wherein at least one of said top ferromagnetic bias layer and said bottom ferromagnetic bias layer comprises an alloy selected from the group consisting of CoPt, CoFe, CoPtCr, CoPtTa, CoPtCrB, and permalloy.

23. A magnetic read head comprising:
   a) a magnetic sensor having a ferromagnetic free layer having a magnetization $M_0$ responsive to an external magnetic field;
   b) a longitudinal bias structure positioned adjacent to said ferromagnetic free layer for biasing said ferromagnetic free layer, said longitudinal bias structure comprising:
      1) a top ferromagnetic bias layer of first thickness $t_1$ having a first magnetic moment $M_1$;
      2) a bottom ferromagnetic bias layer of second thickness $t_2$ having a second magnetic moment $M_2$ antiparallel to said first magnetic moment $M_1$;
      3) an exchange-coupling layer disposed between said top ferromagnetic bias layer and said bottom ferromagnetic bias layer, such that said top ferromagnetic bias layer and said bottom ferromagnetic bias layer are antiferromagnetically coupled by said exchange-coupling layer;

whereby a remnant magnetization thickness product $M_r t$ of said longitudinal bias structure is equal to $M_1 t_1 - M_2 t_2$.

24. The magnetic read head of claim 23, wherein said magnetic sensor is selected from the group consisting of anisotropic magnetoresistive (AMR) sensors, giant magnetoresistive (GMR) spin valve sensors, GMR multilayer sensors and tunnel valve sensors.

25. The magnetic read head of claim 23, further comprising an antiferromagnetic layer next to said bottom ferromagnetic bias layer, thereby creating a pinned longitudinal bias structure.

26. The magnetic read head of claim 23, wherein said bottom ferromagnetic bias layer comprises a portion of said free layer.

* * * * *